US012740082B2

(12) United States Patent
Lin et al.

(10) Patent No.: US 12,740,082 B2
(45) Date of Patent: Sep. 15, 2026

(54) MANUFACTURING METHOD OF SEMICONDUCTOR DEVICE

(71) Applicant: UNITED MICROELECTRONICS CORP., Hsin-Chu City (TW)

(72) Inventors: Da-Jun Lin, Kaohsiung City (TW); Fu-Yu Tsai, Tainan City (TW); Bin-Siang Tsai, Changhua County (TW); Chung-Yi Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 843 days.

(21) Appl. No.: 17/838,258

(22) Filed: Jun. 12, 2022

(65) Prior Publication Data

US 2023/0378313 A1 Nov. 23, 2023

(30) Foreign Application Priority Data

May 20, 2022 (CN) ........................ 202210558734.6

(51) Int. Cl.

*H10D 30/01* (2025.01)
*H10D 30/47* (2025.01)
*H10D 64/27* (2025.01)

(52) U.S. Cl.

CPC ........... *H10D 30/015* (2025.01); *H10D 30/47* (2025.01); *H10D 64/411* (2025.01)

(58) Field of Classification Search

CPC ........................ H10D 30/015; H10D 64/0116
See application file for complete search history.

(56) References Cited

U.S. PATENT DOCUMENTS

| | | | | |
|---|---|---|---|---|
| 8,502,337 | B2 | 8/2013 | Horii | |
| 8,541,818 | B2 | 9/2013 | Wu | |
| 8,748,900 | B1 * | 6/2014 | Dargis | H10D 30/021 438/604 |
| 11,955,522 | B2 * | 4/2024 | Chou et al. | H01L 29/778 |
| 2010/0330764 | A1 | 12/2010 | Akiyama | |
| 2012/0115326 | A1 * | 5/2012 | Frohberg | H10D 64/0112 257/E21.296 |

(Continued)

FOREIGN PATENT DOCUMENTS

| | | | | |
|---|---|---|---|---|
| CN | 103065965 | * | 4/2013 | H01L 21/336 |
| CN | 103367418 | A | 10/2013 | |

(Continued)

OTHER PUBLICATIONS

L.V. Azaroff, J.J. Brophy , Electronic Processes in Materials, 1963, McGraw-Hill, pp. 227-230 (Year: 1963).*

(Continued)

*Primary Examiner* — Christopher A Johnson
(74) *Attorney, Agent, or Firm* — Winston Hsu

(57) ABSTRACT

A manufacturing method of a semiconductor device includes the following steps. A gate structure is formed on a III-V compound semiconductor layer. A gate silicide layer and a source/drain silicide layer are formed by an anneal process. The gate silicide layer is formed on the gate structure, the source/drain silicide layer is formed on the III-V compound semiconductor layer, and a material composition of the gate silicide layer is different from a material composition of the source/drain silicide layer.

15 Claims, 4 Drawing Sheets

(56) References Cited

U.S. PATENT DOCUMENTS

2015/0069408 A1 3/2015 Nanjo
2019/0252510 A1* 8/2019 Yao ...................... H10D 30/015
2020/0098885 A1 3/2020 Then
2020/0105880 A1* 4/2020 Dasgupta ............. H10D 30/015
2021/0005742 A1 1/2021 Ujita
2021/0257467 A1 8/2021 Chou
2022/0172982 A1* 6/2022 Liu et al. .............. H01L 21/762

FOREIGN PATENT DOCUMENTS

CN 105977292 A 9/2016
TW 201842642 A 12/2018

OTHER PUBLICATIONS

T. Mimura, Development of High Electron Mobility Transistor, 2005, Japanese Journal of Applied Physics,j44 pp. 8263-8268 (Year: 2005).*

C.Y. Kim et al., Effects of titanium silicide on AuSiTi/n-GaN ohmic contact systems, 1998, Journal of Crystal Growth 189/190, pp. 720-724. (Year: 1998).*

R.C. Jaeger, Introduction to Microelectronic Fabrication, 1988, Addison-Wesley, 16, 17, 20, 144. (Year: 1988).*

G. Cheng, The Difficulty and Solution of Mg-doped in GaN, 2020, IOP Conf. Series: Materials Science and Engineering 729, IOP Publishing, pp. 1-5 (Year: 2020).*

Field Effect Devices, 2nd Edition; Robert F. Pierret, Addison-Wesley Publishing Company, 1990, pp. 29-30 (Year: 1990).*

* cited by examiner

MANUFACTURING METHOD OF SEMICONDUCTOR DEVICE

BACKGROUND OF THE INVENTION

1. Field of the Invention

The present invention relates to a manufacturing method of a semiconductor device, and more particularly, to a manufacturing method of a semiconductor device including a III-V compound semiconductor layer.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different band-gaps are combined and heterojunction is formed at the junction between the semiconductor materials as a channel for carriers. In recent years, gallium nitride (GaN) based materials have been applied in the high power and high frequency products because of the properties of wider band-gap and high saturation velocity. Two-dimensional electron gas (2DEG) may be generated by the piezoelectricity property of the GaN-based materials, and the switching velocity may be enhanced because of the higher electron velocity and the higher electron density of the 2DEG. In addition, there are many structural designs of the III-V compound semiconductor transistor for different product specifications, the manufacturing method becomes complicated accordingly, and the manufacturing yield and/or the manufacturing cost may be adversely influenced.

SUMMARY OF THE INVENTION

A manufacturing method of a semiconductor device is provided in the present invention. A gate silicide layer and a source/drain silicide layer with difference material compositions are formed by an annealing process, and the purpose of process simplification may be achieved accordingly.

According to an embodiment of the present invention, a manufacturing method of a semiconductor device is provided. The manufacturing method includes the following steps. A gate structure is formed on a III-V compound semiconductor layer. A gate silicide layer and a source/drain silicide layer are formed by an anneal process. The gate silicide layer is formed on the gate structure, the source/drain silicide layer is formed on the III-V compound semiconductor layer, and a material composition of the gate silicide layer is different from a material composition of the source/drain silicide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a manufacturing method of a semiconductor device according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figures 1, 2:
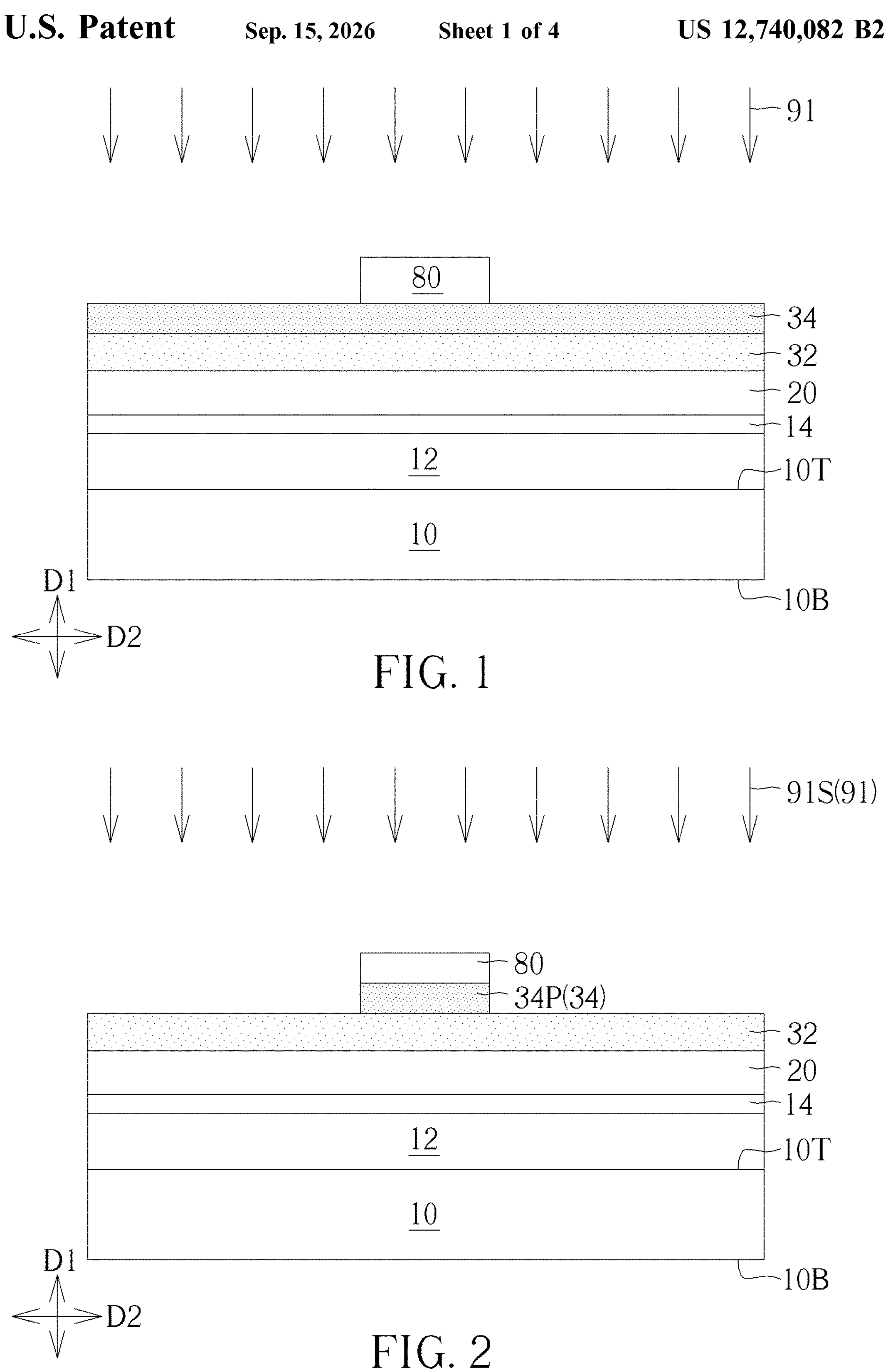
Figure 3:
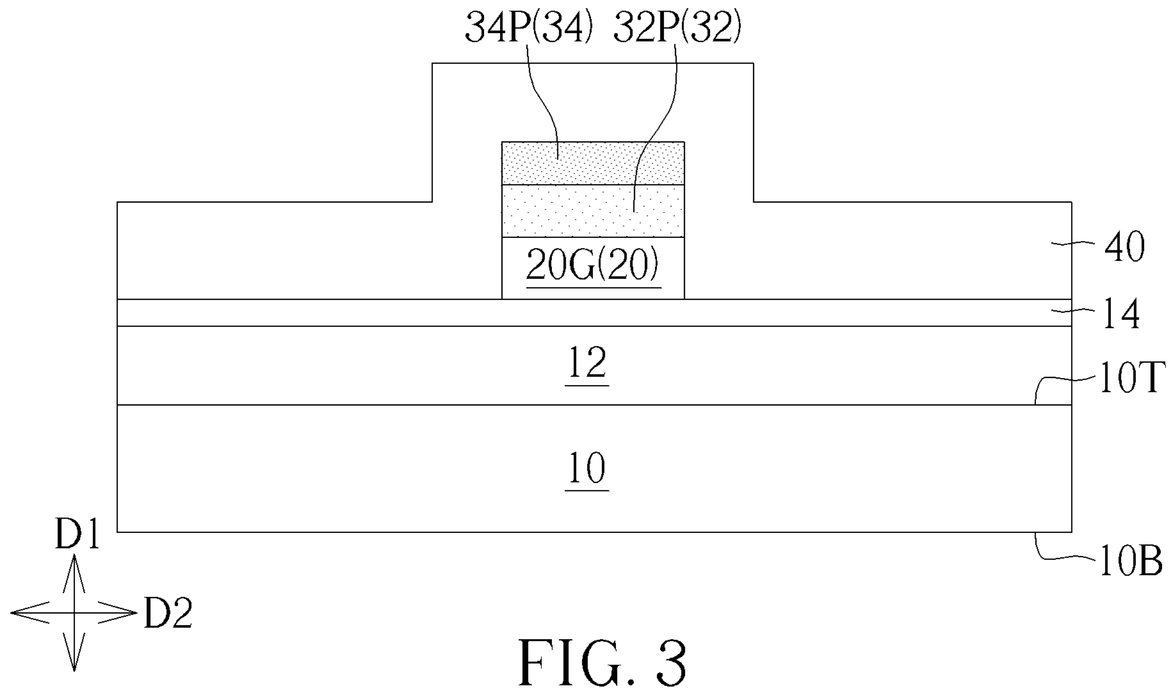
Figure 4:
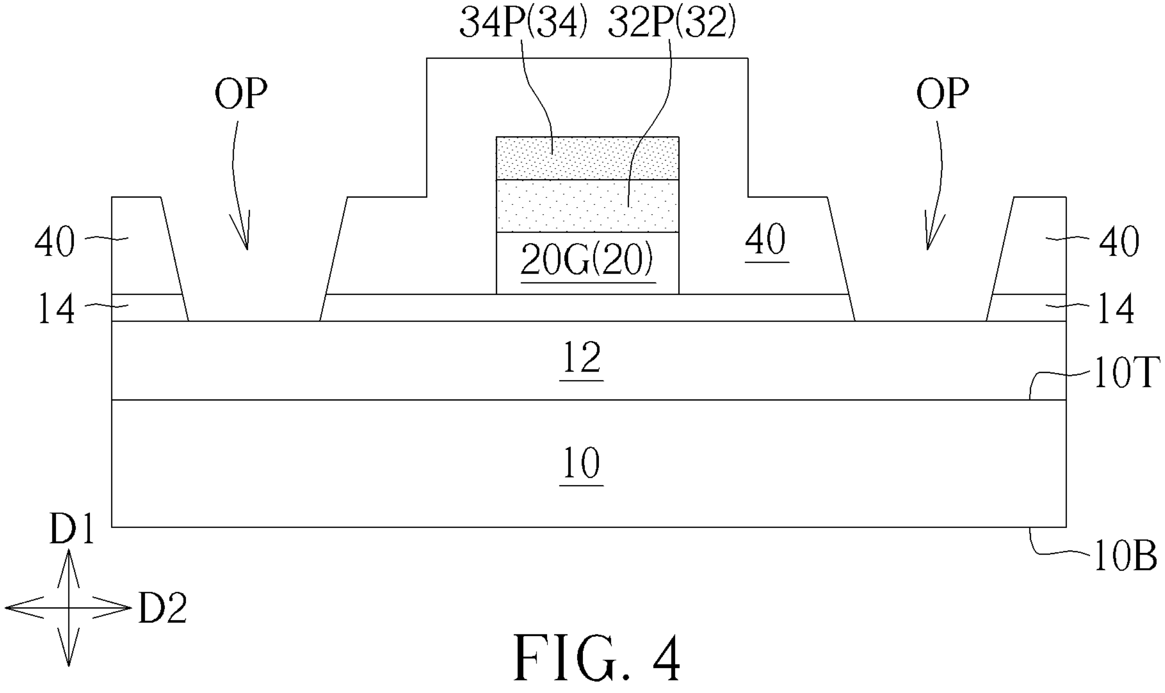
Figure 5:
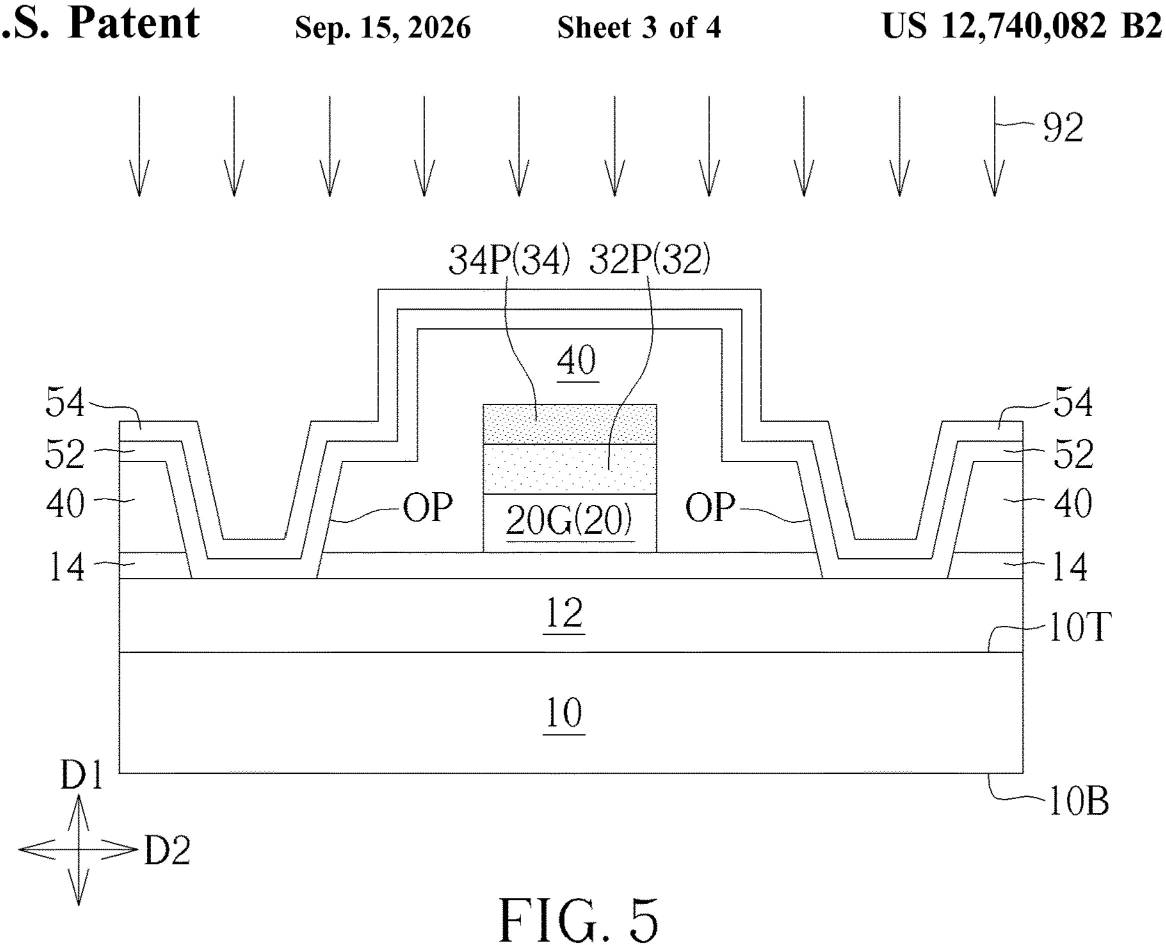
Figure 6:
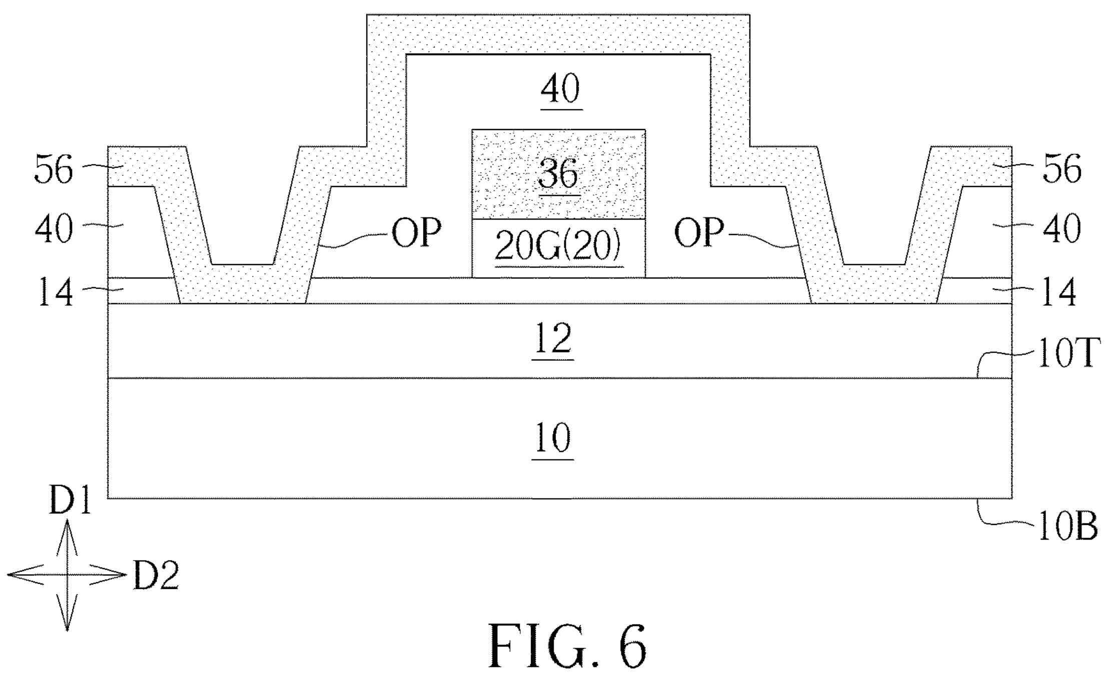
Figures 7, 8:
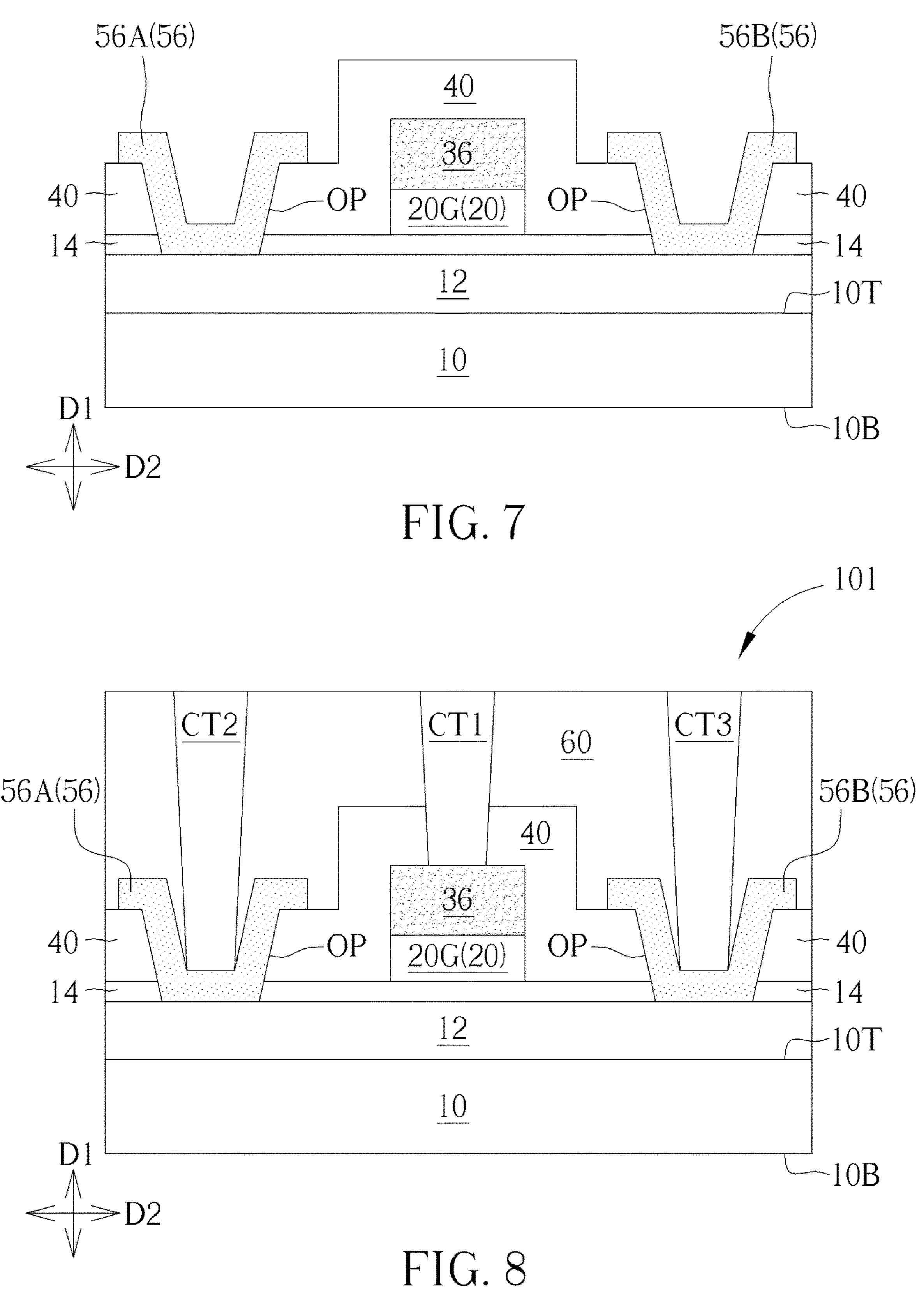

Please refer to FIGS. 1-8. FIGS. 1-8 are schematic drawings illustrating a manufacturing method of a semiconductor device according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7. As shown in FIG. 8, a manufacturing method of a semiconductor device 101 in this embodiment may include the following steps. A gate structure 20G is formed on a III-V compound semiconductor layer 12. Subsequently, a gate silicide layer 36 and a source/drain silicide layer 56 are formed by an anneal process. The gate silicide layer 36 is formed on the gate structure 20G, the source/drain silicide layer 56 is formed on the III-V compound semiconductor layer 12, and a material composition of the gate silicide layer 36 is different from a material composition of the source/drain silicide layer 56. By forming the gate silicide layer 36 and the source/drain silicide layer 56 with different material compositions via the same annealing process, the total number of annealing processes used in the manufacturing method and/or the adverse influence of the annealing process on the semiconductor device may be reduced, and the purposes of process simplification and/or electrical performance enhancement of the semiconductor devise may be achieved accordingly.

Specifically, the manufacturing method of the semiconductor device in this embodiment may include but is not limited to the following steps. As shown in FIG. 1, the III-V compound semiconductor layer 12, a III-V compound barrier layer 14, a gate material layer 20, a first metal layer 32, and a first silicon layer 34 may be sequentially formed on a substrate 10. In other words, the gate material layer 20 may be regarded as being formed on the III-V compound semiconductor layer 12 in a vertical direction D1, the first metal layer 32 may be regarded as being formed on the gate material layer 20 in the vertical direction D1, and the first silicon layer 34 may be regarded as being formed on the first metal layer 32 in the vertical direction D1. The substrate 10 may include a silicon substrate, a silicon carbide (SiC) substrate, a gallium nitride (GaN) substrate, a sapphire substrate, or a substrate made of other suitable materials. In some embodiments, a buffer layer (not illustrated) may be formed on the substrate 10 before the step of forming the III-V compound semiconductor layer 12, and the buffer layer may include gallium nitride, aluminum gallium nitride (AlGaN), aluminum indium nitride (AlInN), or other suitable buffer materials, but not limited thereto. In other words, the buffer layer may be located between the substrate 10 and the III-V compound semiconductor layer 12 in the vertical direction D1.

In some embodiments, the III-V compound semiconductor layer 12 may include gallium nitride, indium gallium nitride (InGaN), or other suitable III-V compound semiconductor materials. The III-V compound barrier layer 14 may include aluminum gallium nitride, aluminum indium nitride, aluminum gallium indium nitride (AlGaInN), aluminum nitride (AlN), or other suitable III-V compound materials. In some embodiments, the gate material layer 20 may include a p-type doped III-V compound material, such as p-type doped aluminum gallium nitride, p-type doped gallium nitride, or other suitable p-type doped III-V compound materials, but not limited thereto. In addition, the p-type dopant in the p-type doped III-V compound may include cyclopentadienyl magnesium ($Cp_2Mg$), magnesium, beryllium (Be), zinc (Zn), a combination of the materials described above, or other suitable p-type dopants. Additionally, the first metal layer 32 and the first silicon layer 34 may be used for forming the gate silicide layer described above, and the material of the first metal layer 32 may be modified in accordance with the material composition of the gate silicide layer subsequently formed. For example, the first metal layer 32 may include nickel, cobalt, platinum, or other suitable metallic materials, and the first silicon layer 34 may be a pure silicon layer, such as a single crystal silicon layer, a polycrystalline silicon layer, an amorphous silicon layer, or a silicon layer with other structures, but not limited thereto.

In some embodiments, the vertical direction D1 described above may be regarded as a thickness direction of the substrate 10. The substrate 10 may have a top surface 10T and a bottom surface 10B opposite to the top surface 10T in the vertical direction D1, and the III-V compound semiconductor layer 12, the III-V compound barrier layer 14, the gate material layer 20, the first metal layer 32, and the first silicon layer 34 described above may be formed at a side of the top surface 10T. A horizontal direction substantially orthogonal to the vertical direction D1 (such as a horizontal direction D2 or other directions orthogonal to the vertical direction D1) may be substantially parallel with the top surface 10T and/or the bottom surface 10B of the substrate 10, but not limited thereto. In this description, a distance between the bottom surface 10B of the substrate 10 and a relatively higher location and/or a relatively higher part in the vertical direction D1 may be greater than a distance between the bottom surface 10B of the substrate 10 and a relatively lower location and/or a relatively lower part in the vertical direction D1. The bottom or a lower portion of each component may be closer to the bottom surface 10B of the substrate 10 in the vertical direction D1 than the top or upper portion of this component. Another component disposed above a specific component may be regarded as being relatively far from the bottom surface 10B of the substrate 10 in the vertical direction D1, and another component disposed under a specific component may be regarded as being relatively closer to the bottom surface 10B of the substrate 10 in the vertical direction D1.

As shown in FIGS. 1-3, after the step of forming the first silicon layer 34, a patterning process 91 may be performed to the first silicon layer 34, the first metal layer 32, and the gate material layer 20 for forming a silicon pattern 34P, a metal pattern 32P, and the gate structure 20G, respectively. In some embodiments, after the step of forming the first silicon layer 34, a patterned mask layer 80 may be formed on the first silicon layer 34, and the patterning process 91 may be carried out by using the patterned mask layer 80, but not limited thereto. In addition, the patterning process 91 may include one or a plurality of etching steps for etching the first silicon layer 34, the first metal layer 32, and the gate material layer 20, respectively, and the silicon pattern 34P, the metal pattern 32P, and the gate structure 20G may be formed accordingly. For example, after the first silicon layer 34 is patterned by the patterning process 91 to become the silicon pattern 34P, the silicon pattern 34P and/or the remaining patterned mask layer 80 may be used as an etching mask in an etching step 91S configured for patterning the first metal layer 32 or patterning the first metal layer 32 and the gate material layer 20. In some embodiments, the patterned mask layer 80 may be removed before the etching step 91S or be etched in the etching step 91S without remaining on the silicon pattern 34P, and the etching step 91S may be regarded as an etching step using the silicon pattern 34P as an etching mask accordingly, but not limited thereto. In other words, the patterning process 91 may include the etching step 91S using the silicon pattern 34P as an etching mask, and the first metal layer 32 may be etched by the etching step 91S to become the metal pattern 32P.

It is worth noting that, the method of forming the gate structure 20G, the metal pattern 32P, and the silicon pattern 34P in the present invention may include but is not limited to the steps described above. In other words, other suitable approaches may be applied to form the gate structure 20G, the metal pattern 32P, and the silicon pattern 34P illustrated in FIG. 3. In addition, when the first silicon layer 34, the first metal layer 32, and the gate material layer 20 are patterned by the patterning process 91 to become the silicon pattern 34P, the metal pattern 32P, and the gate structure 20G, respectively, the shapes and/or the areas of the projection pattern of the silicon pattern 34P in the vertical direction D1, the projection pattern of the metal pattern 32P in the vertical direction D1, and the projection pattern of the gate structure 20G in the vertical direction D1 may be substantially identical to or equal to one another, but not limited thereto. Additionally, the material composition of the silicon pattern 34P, the material composition of the metal pattern 32P, and the material composition of the gate structure 20G may be the same as the material composition of the first silicon layer 34, the material composition of the first metal layer 32, and the material composition of the gate material layer 20, respectively. The metal pattern 32P may be regarded as being formed on the gate structure 20G, and the silicon pattern 34P may be regarded as being formed on the metal pattern 32P. After the gate structure 20G, the metal pattern 32P, and the silicon pattern 34P are formed, a passivation layer 40 may be formed covering the gate structure 20G, the metal pattern 32P, the silicon pattern 34P, the III-V compound barrier layer 14, and the III-V compound semiconductor layer 12. The passivation layer 40 may include silicon oxide, silicon nitride, tetraethoxy silane (TEOS), or other suitable insulation materials.

As shown in FIGS. 4-6, the annealing process 92 may be carried out after the step of forming the passivation layer 40. The passivation layer 40 may cover the gate structure 20G, the metal pattern 32P, the silicon pattern 34P, the III-V compound barrier layer 14, and the III-V compound semiconductor layer 12 in the annealing process 92, and the metal pattern 32P and the silicon pattern 34P may be converted into the gate silicide layer 36 via the annealing process 92. In some embodiments, the annealing process 92 may include a rapid thermal processing (RTP) or other suitable thermal processing approaches. In some embodiments, the gate silicide layer 36 may include nickel silicide, cobalt silicide, platinum silicide, or other suitable electrically conductive silicide materials. In addition, the method of forming the gate silicide layer 36 in the present invention may include but is not limited to the above-mentioned approach for forming the metal pattern 32P and the silicon pattern 34P. In other words, other material layers may be applied for forming the gate silicide layer 36 via the annealing process 92 in some embodiments according to some design considerations. Additionally, in some embodiments, before the annealing process 92, an opening OP may be formed penetrating through the passivation layer 40 on the III-V compound semiconductor layer 12. After the step of forming the opening OP, a second silicon layer 52 may be formed, and a second metal layer 54 may be formed on the second silicon layer 52. At least a part of the second silicon layer 52 may be formed in the opening OP, and the second silicon layer 52 and the second metal layer 54 may be converted into the source/drain silicide layer 56 via the annealing process 92.

In some embodiments, the material of the second metal layer 54 may be modified in accordance with the material composition of the source/drain silicide layer 56 subsequently formed. For example, the source/drain silicide layer 56 may include titanium silicide, tantalum silicide, titanium aluminum silicide, or other suitable electrically conductive silicide materials. Therefore, the second metal layer 54 may include titanium, tantalum, titanium aluminide, or other suitable metallic materials, and the second silicon layer 52 may be a pure silicon layer, such as a single crystal silicon layer, a polycrystalline silicon layer, an amorphous silicon layer, or a silicon layer with other structures, but not limited thereto. In other words, the material composition of the metal pattern 32P (i.e. the material composition of the first metal layer 32) is different from the material composition of the second metal layer 54 because the material composition of the gate silicide layer 36 is different from the material composition of the source/drain silicide layer 56. In some embodiments, the second silicon layer 52 may be formed conformally on the passivation layer 40 and formed conformally in the opening OP, and the second metal layer 54 may be formed conformally on the second silicon layer 52, but not limited thereto. In addition, the second silicon layer 52 may be further formed on the passivation layer 40 located above the gate structure 20G, and the source/drain silicide layer 56 may be further formed on the passivation layer 40 located above the gate structure 20G after the annealing process accordingly, but not limited thereto.

In some embodiments, the process temperature for converting the metal pattern 32P and the silicon pattern 34P into the gate silicide layer 36 may be substantially equal to or lower than the process temperature for converting the second silicon layer 52 and the second metal layer 54 into the source/drain silicide layer 56, and the gate silicide layer 36 and the source/drain silicide layer 56 may be formed via the annealing process 92 accordingly. For example, a process temperature of the annealing process 92 may range from 550 degrees Celsius to 650 degrees Celsius, but not limited thereto. In addition, the method of forming the source/drain silicide layer 56 in the present invention may include but is not limited to the above-mentioned approach for forming the second silicon layer 52 and the second metal layer 54 described above. In other words, other material layers may be applied for forming the source/drain silicide layer 56 via the annealing process 92 in some embodiments according to some design considerations.

As shown in FIGS. 5-7, after the annealing process 92, the source/drain silicide layer 56 formed on the passivation layer 40 located above the gate structure 20G and a part of other portion of the source/drain silicide layer 56 may be removed for forming a first source/drain silicide layer 56A and a second source/drain silicide layer 56B. In some embodiments, two openings OP may be formed at two opposite sides of the gate structure 20G in the horizontal direction D2, and the first source/drain silicide layer 56A and the second source/drain silicide layer 56B may be at least partly disposed in the corresponding openings OP, respectively. Therefore, the first source/drain silicide layer 56A and the second source/drain silicide layer 56B may be disposed at two opposite sides of the gate structure 20G in the horizontal direction D2, but not limited thereto. In some embodiments, the opening OP may further penetrate through the III-V compound barrier layer 14, and the source/drain silicide layer 56 (such as the first source/drain silicide layer 56A and the second source/drain silicide layer 56B) may directly contact the III-V compound semiconductor layer 12 accordingly, but not limited thereto. In some embodiments, the opening OP may penetrate through the passivation layer 40 without penetrating through the III-V compound barrier layer 14, and a portion of the III-V compound barrier layer 14 may be located between the source/drain silicide layer 56 and the III-V compound semiconductor layer 12 in the vertical direction D1 accordingly.

As shown in FIG. 8, after the step of forming the first source/drain silicide layer 56A and the second source/drain silicide layer 56B, a dielectric layer 60 may be formed covering the passivation layer 40, the first source/drain silicide layer 56A, and the second source/drain silicide layer 56B. A contact structure CT1, a contact structure CT2, and a contact structure CT3 may be formed corresponding to the gate silicide layer 36, the first source/drain silicide layer 56A, and the second source/drain silicide layer 56B, respectively. The contact structure CT1 may penetrate through the dielectric layer 60 and the passivation layer 40 located on the gate silicide layer 36 in the vertical direction D1 for contacting and being electrically connected with the gate silicide layer 36. The contact structure CT2 may penetrate through the dielectric layer 60 located on the first source/drain silicide layer 56A in the vertical direction D1 for contacting and being electrically connected with the first source/drain silicide layer 56A. The contact structure CT3 may penetrate through the dielectric layer 60 located on the second source/drain silicide layer 56B in the vertical direction D1 for contacting and being electrically connected with the second source/drain silicide layer 56B. In some embodiments, the dielectric layer 60 may include a single layer or multiple layers of dielectric materials, such as oxide dielectric materials or other suitable dielectric materials, and each contact structure may include a barrier layer (not illustrated) and a metal layer (not illustrated) disposed on the barrier layer, but not limited thereto. The barrier layer mentioned above may include titanium, titanium nitride, tantalum, tantalum nitride, or other suitable barrier materials, and the metal layer mentioned above may include tungsten, copper, aluminum, titanium aluminide, or other suitable metallic materials.

The semiconductor device 101 shown in FIG. 8 may be formed by the manufacturing method described above. The semiconductor device 101 may include the substrate 10, the III-V compound semiconductor layer 12, the III-V compound barrier layer 14, the gate structure 20G, the gate silicide layer 36, the passivation layer 40, the first source/drain silicide layer 56A, the second source/drain silicide layer 56B, the dielectric layer 60, the contact structure CT1, the contact structure CT2, and the contact structure CT3 described above. In some embodiments, the contact structure CT1 may be regarded as a gate electrode, the contact structure CT2 may be regarded as a source electrode, and the contact structure CT3 may be regarded as a drain electrode, but not limited thereto. Comparatively, the gate silicide layer 36 may be regarded as a contact pad of the gate electrode, the first source/drain silicide layer 56A may be regarded as a contact pad of the source electrode, and the second source/drain silicide layer 56B may be regarded as a contact pad of the drain electrode. The gate silicide layer 36 may be applied for forming a Schottky contact, and the source/drain silicide layer 56 may be applied for forming an Ohmic contact. Therefore, the material composition of the gate silicide layer 36 is different from the material composition of the source/drain silicide layer 56, and a work function of the source/drain silicide layer 56 may be relatively low for realizing the Ohmic contact. Accordingly, a work function of the gate silicide layer 36 may be higher than the work function of the source/drain silicide layer 56, but not limited thereto.

To summarize the above descriptions, in the manufacturing method of the semiconductor device according to the present invention, the gate silicide layer and the source/drain silicide layer with difference material compositions may be formed by the annealing process. The total number of the annealing processes used in the manufacturing method and/or the adverse influence of the annealing process on the semiconductor device may be reduced, and the purposes of process simplification and/or electrical performance enhancement of the semiconductor devise may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:

forming a gate structure on a III-V compound semiconductor layer; and forming a gate silicide layer and a source/drain silicide layer by an anneal process, wherein the gate silicide layer is formed on the gate structure, the source/drain silicide layer is formed on the III-V compound semiconductor layer, and a material composition of the gate silicide layer is different from a material composition of the source/drain silicide layer, wherein a method of forming the gate silicide layer comprises:

forming a metal pattern on the gate structure;

forming a silicon pattern on the metal pattern; and forming a passivation layer covering the gate structure, the metal pattern, the silicon pattern, and the III-V compound semiconductor layer, wherein the annealing process is performed after the passivation layer is formed, the metal pattern and the silicon pattern are converted into the gate silicide layer by the annealing process, and a method of forming the source/drain silicide layer comprises:

forming an opening penetrating through the passivation layer on the III-V compound semiconductor layer;

forming a second silicon layer, wherein at least a part of the second silicon layer is formed in the opening; and forming a second metal layer on the second silicon layer, wherein the second silicon layer and the second metal layer are converted into the source/drain silicide layer by the annealing process.

2. The manufacturing method of the semiconductor device according to claim 1, wherein a work function of the gate silicide layer is higher than a work function of the source/drain silicide layer.

3. The manufacturing method of the semiconductor device according to claim 1, wherein the gate silicide layer comprises nickel silicide, cobalt silicide, or platinum silicide.

4. The manufacturing method of the semiconductor device according to claim 1, wherein the source/drain silicide layer comprises titanium silicide, tantalum silicide, or titanium aluminum silicide.

5. The manufacturing method of the semiconductor device according to claim 1, wherein the passivation layer covers the gate structure, the metal pattern, the silicon pattern, and the III-V compound semiconductor layer in the annealing process.

6. The manufacturing method of the semiconductor device according to claim 1, wherein a method of forming the gate structure, the metal pattern, and the silicon pattern comprises:

forming a gate material layer on the III-V compound semiconductor layer;

forming a first metal layer on the gate material layer;

forming a first silicon layer on the first metal layer; and
performing a patterning process to the first silicon layer, the first metal layer, and
the gate material layer.

7. The manufacturing method of the semiconductor device according to claim 6, wherein the first silicon layer, the first metal layer, and the gate material layer are patterned by the patterning process to become the silicon pattern, the metal pattern, and the gate structure, respectively.

8. The manufacturing method of the semiconductor device according to claim 6, wherein the patterning process comprises an etching step using the silicon pattern as an etching mask, and the first metal layer is etched by the etching step for forming the metal pattern.

9. The manufacturing method of the semiconductor device according to claim 1, wherein the second silicon layer is further formed on the passivation layer located above the gate structure.

10. The manufacturing method of the semiconductor device according to claim 1, wherein the source/drain silicide layer is further formed on the passivation layer located above the gate structure, and the source/drain silicide layer formed on the passivation layer located above the gate structure is removed after the annealing process.

11. The manufacturing method of the semiconductor device according to claim 1, wherein a material composition of the metal pattern is different from a material composition of the second metal layer.

12. The manufacturing method of the semiconductor device according to claim 1, wherein the second silicon layer is conformally formed on the passivation layer and conformally formed in the opening.

13. The manufacturing method of the semiconductor device according to claim 1, wherein the second metal layer is conformally formed on the second silicon layer.

14. The manufacturing method of the semiconductor device according to claim 1, wherein the gate structure comprises a p-type doped III-V compound material.

15. The manufacturing method of the semiconductor device according to claim 1, wherein a process temperature of the annealing process ranges from 550 degrees Celsius to 650 degrees Celsius.

* * * * *